United States Patent
Suetsugu et al.

(10) Patent No.: US 7,047,635 B2
(45) Date of Patent: May 23, 2006

(54) CONNECTING MATERIAL AND CONNECTING METHOD

(75) Inventors: Kenichiro Suetsugu, Nishinomiya (JP); Takaharu Gamo, Fujiidera (JP); Shunji Hibino, Hirakata (JP); Yoshio Morita, Suita (JP); Mikiya Nakata, Suita (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 678 days.

(21) Appl. No.: 09/805,153

(22) Filed: Mar. 14, 2001

(65) Prior Publication Data

US 2002/0022000 A1 Feb. 21, 2002

(30) Foreign Application Priority Data

Mar. 15, 2000 (JP) .............................. 2000-071636

(51) Int. Cl.
*H05K 3/34* (2006.01)
*B23K 35/34* (2006.01)
*B23K 28/00* (2006.01)

(52) U.S. Cl. ........................... 29/840; 29/739; 29/825; 228/262.1; 228/264; 148/24

(58) Field of Classification Search ................ 228/264, 228/119, 262.1; 148/22, 24, 23; 29/739, 29/825, 830, 840
See application file for complete search history.

(56) References Cited

U.S. PATENT DOCUMENTS

| 3,136,633 | A | * | 6/1964 | Berry ........................ 420/508 |
| 3,879,836 | A | * | 4/1975 | Coffin ........................ 228/264 |
| 4,038,579 | A | * | 7/1977 | Ekkelboom ................ 313/331 |
| 4,197,957 | A | * | 4/1980 | Buhrer .................... 220/2.1 R |
| 4,580,714 | A | * | 4/1986 | Mayer et al. ................ 228/121 |
| 4,817,851 | A | * | 4/1989 | Kolesar et al. ............. 228/119 |
| 5,127,969 | A | * | 7/1992 | Sekhar ........................ 148/23 |
| 5,197,655 | A | * | 3/1993 | Leerssen et al. ............ 228/254 |
| 5,567,525 | A | * | 10/1996 | Kapoor et al. .............. 428/408 |
| 5,830,292 | A | * | 11/1998 | Eiter et al. .................. 148/528 |
| 6,159,267 | A | * | 12/2000 | Hampden-Smith et al. ... 75/252 |
| 6,302,973 | B1 | * | 10/2001 | Haszler et al. .............. 148/437 |
| 6,574,859 | B1 | * | 6/2003 | Farooq et al. ................ 29/830 |

FOREIGN PATENT DOCUMENTS

| JP | 63-17267 A | * | 1/1988 |
| JP | 10-261866 A | * | 9/1988 |
| JP | 06-239668 A | * | 8/1994 |
| JP | 3125043 |  | 11/2000 |

OTHER PUBLICATIONS

Patent Abstracts of Japan, by Suga Tadatomo et al., entitled "Separable Joined Structure and Separating Method Thereof".

N. Hosoda et. al., entitled "Selective Disassembly", The fourth International Conference on Ecomaterials, (1999), pp. 91-94.

* cited by examiner

*Primary Examiner*—Lynne R. Edmondson
(74) *Attorney, Agent, or Firm*—Wenderoth, Lind & Ponack, L.L.P.

(57) ABSTRACT

A connecting material can form a detachable connecting structure. According to the connecting material, a connecting portion between a certain object and another object can be more readily formed, and the certain object can be more readily detached from the another object after formation of the connecting portion. The connecting material comprises a solder material and a hydrogen storage metal material which is able to occlude hydrogen, and which is in the form of particles dispersed in the connecting material.

64 Claims, 3 Drawing Sheets

CONNECTING MATERIAL AND CONNECTING METHOD

CROSS-REFERENCE TO RELATED APPLICATIONS

The present application claims a priority under 35 U.S.C. §119 to Japanese Patent Application No. 2000-71636, filed on Mar. 15, 2000, entitled CONNECTING MATERIAL AND CONNECTING METHOD". The contents of that application which are relevant to the invention of the present application are incorporated herein by reference thereto in its entirety.

BACKGROUND OF THE INVENTION

1. Field of the Invention

The present invention relates to a connecting material for connecting a certain object(s) to another object, and more particularly a connecting material for connecting a certain object(s) such as an electronic component(s) to another object such as a circuit board (or a substrate). Furthermore, the present invention relates to an electronic circuit board which is produced by using such connecting material, and to a method for producing the electronic circuit board, as well as a method for detaching a certain object (such as an electronic component) from another object (such as a circuit board) to which the object was connected.

2. Description of Related Art

Recently, it has been tried to recycle an electronic component which was connected to an electronic circuit board used for various electrical or electronic devices including a personal computer, a mobile phone and the like, in view of environmental protection and resource-saving. Additionally, a price of an electronic component which is mounted on an electronic circuit board has been increased with advancement of its performance, so that it is very important to reuse such an expensive electronic component in order to reduce a production cost of an electronic circuit board.

In a conventional recovering method of an electronic component for recycling the electronic component, a connecting portion which is formed of a connecting material such as a solder, and connects an electronic component to a circuit board, is mechanically removed or broken by heating a spent electronic circuit board, applying a blade or the like to a surface of the circuit board and moving the blade parallel to a plane of the circuit board so as to scrape the electronic component off the circuit board and recover the electronic component.

However, according to the conventional recycling method as described above, an impact against an electronic component is strong, and a lead (e.g. electrode) which is led out from the electronic component is deformed and/or damaged. The electronic component itself is sometimes damaged. It is necessary to repair this damaged electronic component for a purpose of reuse thereof, so that the conventional method leads to a larger cost for reuse, which is contrary to its aim. Furthermore, according to the conventional method as described above, electronic components are recovered in a condition where various electronic components, debris generated by destruction and the like are admixed together since all the electronic components mounted on the circuit board are scraped off the circuit board at a time. Currently, thus recovered electronic components are manually classified because classification is too complicated.

In order to make such electronic component recovery easier, a detachable connecting structure is disclosed in Japanese Patent Publication No. 3125043, which is obtained by attaching an intermediate member, in the form of a thin film, to an electronic component and/or a circuit board and connecting the electronic component to the circuit board by virtue of a solder, wherein the intermediate member expands through a reaction with hydrogen to become powder-like or flake off. For the intermediate member of this connecting structure, a hydrogen storage alloy is used. When the intermediate member absorbs hydrogen, it expands or becomes powder-like to destroy a connecting condition between the electronic component and the circuit board, and thereby the electronic component is detached from the circuit board. It is noted that technical particulars which are described in Japanese Patent Publication No. 3125043 and which are applicable to the present invention in relation to the present invention described below are incorporated herein by reference thereto.

In order to obtain such connecting structure, it is needed to form a thin film of a hydrogen storage alloy on an electronic component and/or a circuit board prior to forming a connection by virtue of a solder. For formation of the thin film, it is necessary to add a step of forming such thin film to a conventional process for producing an electronic circuit board. However, this additional step is not desirable because it increases a production facility cost and a production cost. There is a need for further improvement in recovery of an electronic component.

SUMMARY OF THE INVENTION

The present invention has been made for further improving the conventional technique as described above, and the present invention aims to provide a connecting material which can form a detachable connecting structure, wherein a connecting portion between a certain object and another object can be formed more conveniently, and the certain object can be more readily detached from the another object after forming the connecting portion. Additionally, the present invention aims to provide a connecting method using such connecting material, and a detaching method (or a weakening method or a weakening and separating method) of a connecting portion which is formed according to such connecting method.

The present invention provides a connecting material used for connecting (or attaching or bonding) a certain object (hereinafter, which is referred to as "a certain object A" for avoiding confusion) such as an electronic component to another object (hereinafter, which is referred to as "other object B" for avoiding confusion) such as a circuit board, which material comprises a solder material and a hydrogen storage metal material being able to store hydrogen, wherein the hydrogen storage metal material is in the form of particles dispersed in the connecting material. The connecting material of the present invention contains the solder material and the hydrogen storage metal material in a form of particles, and a connecting portion formed by using such connecting material of the present invention comprises the solder material, which was melted and solidified, and the hydrogen storage metal material in the form of particles, and it physically and electrically connects the certain object A to the other object B.

Figure 1:
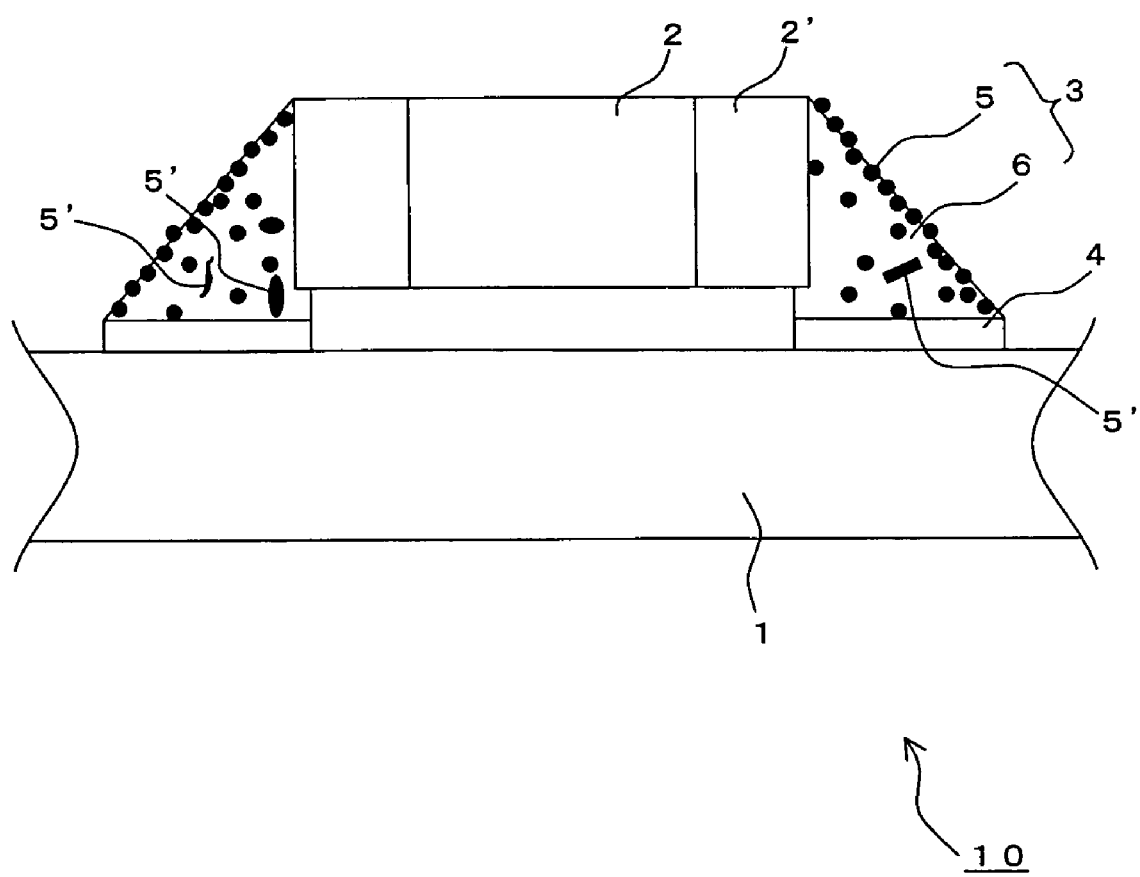
FIG. 1 shows a schematic elevational view of an electronic circuit board having a connecting portion formed by using a connecting material of the present invention, wherein the connecting portion is shown in its cross sectional view for a better understanding of its interior.

Following numerals denote the following elements:
1 . . . substrate (or circuit board),
2 . . . electronic component,
3 . . . connecting material,
4 . . . electrode,
5 . . . hydrogen storage metal particle,
6 . . . solder material,
10 . . . electronic circuit board,
20 . . . chamber,
21 . . . electronic circuit board,
22 . . . table,
23 . . . shaker,
24 . . . heater,
25 . . . blower,
26 . . . hydrogen supplying apparatus,
27 . . . pressure generating apparatus,
30 . . . lead of electronic component,
32 . . . circuit board,
34 . . . connecting portion,
36 . . . solder material,
38 . . . particle of hydrogen storage metal material,
40 . . . crack.

DETAILED DESCRIPTION OF THE PREFERRED EMBODIMENTS

A hydrogen storage metal material used for a connecting material of the present invention is a metal material which can store hydrogen and can release hydrogen which was stored. Further, when a connecting portion comprising such metal material is located in (or exposed to) an atmosphere including hydrogen, such metal material changes in its volume depending on a temperature and a hydrogen pressure (or a partial pressure of hydrogen if the atmosphere also includes gas(es) in addition to hydrogen) of the atmosphere. This change in volume is caused by the metal material occluding (or absorbing) or emitting (or releasing) hydrogen in the atmosphere to which the connecting portion is subjected. Such storage (or such emission) may arise by way of any mechanism as long as the metal material substantially expands (or contracts) in its volume so that an aim of the present invention as described above can be achieved. For example, the storage (or the emission) may arise by a reaction of the metal material with hydrogen (or a reverse reaction thereof), by an adsorption of hydrogen to the metal material (or a desorption of hydrogen from it), and/or by an absorption of hydrogen into the metal material (or a stripping of hydrogen from it) and the like.

The hydrogen storage metal material which can be used for the connecting material of the present invention can be any one of an alloy material and a simple metal material as long as the metal material can change in its volume depending on hydrogen pressure and temperature of an atmosphere in which the metal material is placed. An especially preferable hydrogen storage metal material is a so-called "hydrogen storage alloy", which may comprise particular examples of La based, Ti based, Ca based, and Mg based alloys, and more particular examples of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$ and the like. Furthermore, a simple metal material which can form a hydrogenated metal can also be used as another hydrogen storage metal material. An especially preferable such metal is at least one selected from the group of Pd, V, Ti and Zr.

The connecting material of the present invention comprises a hydrogen storage metal material in the form of particles which may have any shape, and therefore, which may have a regular or an irregular shape. For example, the hydrogen storage metal material may be in the form of a powder, a granule, a chopped fiber, a flake or the like. Such metal material is dispersed in the connecting material in the form of particles. A condition of such dispersion is preferably uniform and can be in a degree of dispersion which is obtained by a conventional mixing method (e.g. stirring, kneading or the like).

The hydrogen storage metal material in the form of particles used for the connecting material of the present invention increases its volume by occluding hydrogen (i.e. the metal material expands) and, in reverse, decreases its volume by emitting hydrogen which has been occluded in the metal material (i.e. the metal material contracts). Whether a hydrogen storage metal material occludes hydrogen or releases occluded hydrogen when the metal material, which has been in a certain former atmosphere, is placed in another atmosphere depends on a condition of the metal material (i.e. a degree of hydrogen storage) of the former atmosphere (i.e. an original atmosphere) and a temperature and a hydrogen pressure of the another atmosphere (i.e. an atmosphere into which the metal material is transferred subsequently).

Thus, any one of expansion and contraction of the hydrogen storage metal material can be achieved when the hydrogen storage metal material is located in the certain atmosphere by combining, in various manners, the degree of hydrogen storage of the hydrogen storage metal material with the temperature and the hydrogen pressure of the certain atmosphere into which the hydrogen storage metal material is to be placed. For example, when a hydrogen storage metal material which has been in an atmosphere comprising no hydrogen and which has been in a state of substantially no occlusion of hydrogen is placed in an atmosphere having a hydrogen pressure, and preferably an atmosphere having a high hydrogen pressure, the hydrogen storage metal material expands by occluding hydrogen. To the contrary, when the hydrogen storage metal material which has expanded by occluding hydrogen as described above is transferred into an atmosphere having a lower hydrogen pressure, preferably an atmosphere having no hydrogen pressure, the hydrogen storage metal material contracts by releasing hydrogen.

It is noted that the expression of "an atmosphere having a hydrogen occlusion (or storage) condition which is sufficient to increase a volume of the hydrogen storage metal material in the form of particles" (which atmosphere is also referred to as an atmosphere (1)) is used in the present specification. The atmosphere (1) means an atmosphere having a condition (of a temperature and/or a pressure condition) where the hydrogen storage metal material in the form of particles increases its volume by occluding hydrogen when it is transferred into such atmosphere (1) since the atmosphere (1) is different from an atmosphere in which the hydrogen storage metal material in the form of particles was located prior to such transfer (which atmosphere is also referred as an atmosphere (0)), so that connecting strength of a connecting portion which contains the hydrogen storage metal material is reduced (or weakened) in at least a part of the connecting portion, and especially in the vicinity of the hydrogen storage metal material in the form of particles. On the other hand, the expression of "an atmosphere having a hydrogen release condition which is sufficient to decrease a volume of the hydrogen storage metal material in the form of particles" is used to mean an atmosphere having a condition where the connecting strength of the connecting portion can be reduced likewise when the hydrogen storage metal material in the form of particles decreases its volume instead of increasing its volume.

It is noted that in a case where the connecting strength does not substantially reduce even though the hydrogen storage metal material in the form of particles increases its volume by occluding hydrogen (for example, a case where an increase of volume is small due to a small amount of hydrogen occlusion so that the connecting strength of the connecting portion is not substantially reduced) when the connecting portion is transferred from the atmosphere (0) to another atmosphere (y), such another atmosphere (y) does not correspond to the atmosphere (1) having the hydrogen occlusion condition which is sufficient to increase the volume of the hydrogen storage metal material in the form of particles. This is also similarly applicable as to a decrease of the volume of the hydrogen storage metal material.

In a case where the connecting strength of the connecting portion comprising the hydrogen storage metal material is reduced in at least a part of the connecting portion through conducting expansion at plural times even though the connecting strength of the connecting portion can not substantially be reduced in at least a part of the connecting portion by conducting expansion once, such as a case where the expansion is repeatedly conducted by switching an atmosphere surrounding the hydrogen storage metal material between the atmosphere (0) and an atmosphere (x) (for example, a case where an atmosphere surrounding the hydrogen storage metal material is changed from the atmosphere (0) to an atmosphere (x) so as to expand the hydrogen storage metal material, followed by changing from the atmosphere (x) to the atmosphere (0) so as to shrink (or contract) the metal material, and changing from the atmosphere (0) to the atmosphere (x) so as to expand the meal material), such atmosphere (x) corresponds to the atmosphere (1) having the hydrogen occlusion condition which is sufficient to increase the volume of the hydrogen storage metal material in the form of particles.

The connecting material of the present invention comprises a solder material in addition to the hydrogen storage metal material. Such solder material is not limited as long as it is generally used as so-called "solder" for an electrical and mechanical connection, and it can be any one of solders which comprise lead and solders which are called "lead free solders". Furthermore, the connecting material may comprise other necessary components, for example, it may comprise a flux, rosin and so on. The flux can act as a binder for these components to be blended. The connecting material of the present invention is produced by blending the hydrogen storage metal material and the solder material and other necessary components. For such blending, any appropriate mixing manner may be used.

In one embodiment, the connecting material of the present invention can be a material in which the hydrogen storage metal material described above is added to a connecting material which is well known as a "cream solder". In this case, the connecting material of the present invention can be produced by blending the hydrogen storage metal material in the form of particles with the "cream solder", and thus resultant connecting material is in the same form as the cream solder (i.e. paste-like or cream form), so that it can be supplied to other object B according to a conventional applying method for a solder material such as a screen printing method or the like.

In a preferred embodiment of the present invention, the hydrogen storage metal material is in a state of storing substantially no hydrogen. In other words, the hydrogen storage metal material is in a state in which it increases its volume (i.e. it can expand) when it is located in an atmosphere having a hydrogen pressure. Such state of storing substantially no hydrogen is ensured by blending the hydrogen storage metal material, which is storing no hydrogen, with solder material and the like in an atmosphere which contains no hydrogen, and thereafter maintaining this resulting blend in an atmosphere which contains substantially no hydrogen.

The connecting material according to the present invention as described above is utilized for a connecting method for connecting certain object A to other object B. Thus, the present invention provides a connecting method which comprises supplying a connecting material of the present invention between these objects (A and B), and melting and cooling a solder material contained in the connecting material to form a connecting portion. This connecting method is conducted in an atmosphere which includes substantially no hydrogen in order to avoid expansion of the hydrogen storage metal material by occluding hydrogen.

In order to connect certain object A to other object B, the connecting material of the present invention can be used in any one of conventional soldering methods, such as a method which is usually used for mounting an electronic component(s) to a circuit board by use of a solder material. In general, certain object A is connected to other object B through a connecting portion derived from the connecting material of the present invention by supplying the connecting material of the present invention onto a predetermined place(s) of the other object B, setting the certain object A so that it contacts with the connecting material, and thereafter heating the connecting material to a temperature which is equal to or higher than a melting temperature of the solder material, and thereafter cooling the connecting material. The connecting material of the present invention may be in the form of a cream solder as described above. In this case, the connecting material can be supplied to the other object B by performing a screen printing method. The connecting material can be heated, for example, by heating the other object B (on which the certain object A is set) in a reflow soldering oven.

It is noted that in a general method for forming a connecting portion by use of a solder, since a connecting portion is formed by melting and cooling a solder in an atmosphere which includes substantially no hydrogen, the hydrogen storage metal material is also maintained in a state of storing substantially no hydrogen after the connecting portion is formed.

In a case where the connecting portion is formed by using the connecting material of the present invention as described above, it has been found that the hydrogen storage metal material in the form of particles tends to move and gather on an exposed surface of the connecting portion between the certain object A and the other object B (i.e. a part of the connecting material which is adjacent to a gaseous (or air) atmosphere around the connecting material before heating it) or in the vicinity of an exposed surface when the connecting material is heated to melt a solder, and that the hydrogen storage metal material remains as it is on the exposed surface or in the vicinity of the exposed surface after cooling. However, this does not intend to exclude that the hydrogen storage metal material in the form of particles exists inside the connecting portion other than on the exposed surface and in the vicinity thereof, and the hydrogen storage metal material may exist inside the connecting portion in addition to at the exposed surface of the connecting portion.

Therefore, when the other object B (thus, the connecting portion) is exposed to a hydrogen atmosphere, the hydrogen storage metal material contained in the connecting portion readily contacts with the hydrogen atmosphere, i.e. readily occludes hydrogen since many particles of the hydrogen storage metal material exist on the exposed surface of the formed connecting portion or in the vicinity of the exposed surface. Furthermore, the connecting portion tends to be formed while having a connecting strength which is close to an inherent strength of the solder material since the number of the particles of the hydrogen storage metal material existing inside the solder material is relatively small, which solder material is melted and solidified to form the connecting portion.

Thus, when the connecting portion comprising such hydrogen storage metal material is exposed to an atmosphere having a hydrogen occlusion condition which is sufficient to increase a volume of the hydrogen storage metal material, the hydrogen metal material in the form of particles expands by readily occluding hydrogen so that a stress by virtue of this expansion acts on a part of the solder material around the particles in the connecting portion, which results in partial cracks generated around the particles to weaken the connecting portion and to break it, as the case may be. Additionally, when the connecting portion comprising the hydrogen storage metal material which has expanded as described above is exposed to an atmosphere having a hydrogen release condition which is sufficient to decrease a volume of the hydrogen storage metal material, the hydrogen metal material contracts by readily releasing hydrogen so that a stress by virtue of this contraction acts on the connecting portion (more particularly, a part of the solder material around the particles of the hydrogen storage metal material), which results in partial cracks generated around the particles to further weaken the connecting portion and to break it, as the case may be. It is noted that the expression "break" means absence of a connecting condition between the certain object A and the other object B by virtue of the connecting portion.

In addition, when the expansion and the contraction as described above are repeatedly conducted, the connecting portion fatigues since stresses in reverse directions repeatedly act on the connecting portion (more particularly, the part of the solder material around the particles of the hydrogen storage metal material) due to such expansion and contraction, and accordingly, the connecting portion is further weakened and preferably broken by cracks which are partly generated in the connecting portion, even though a strength of the connecting portion is not reduced (or the connecting portion is not broken) by the expansion and/or the contraction occurring once. It is noted that the expression "a connecting portion is weakened" means that a connecting strength of the connecting portion initially obtained upon formation of the connecting portion is not maintained, and it is possible that the connecting portion is directly broken without being weakened since whether the connecting portion is weakened or broken depends on an original strength of the connecting portion itself. In general, in a case where the connecting portion is weakened, the certain object A can be detached from the other object B by externally applying an additional force to the connecting portion. In a case where the connecting portion is broken, the certain object A can be detached from the other object B without application of such a force.

Thus, the present invention provides a detaching method of certain object A, for detaching the certain object A from other object B to which the certain object A is connected by virtue of a connecting portion which is formed by using the connecting material of the present invention, wherein the hydrogen storage metal material is in a state of storing substantially no hydrogen, and which method comprises exposing the connecting portion to an atmosphere including hydrogen to make the hydrogen storage metal material occlude hydrogen. In a preferred embodiment of this detaching method, the atmosphere has a hydrogen occlusion condition which is sufficient to increase a volume of the hydrogen storage metal material in the form of particles, and therefore, a volume of the hydrogen storage metal material in the form of particles is increased, so that the connecting portion is weakened or broken.

It is noted that the detaching method of the present invention covers dissolving an electrical and mechanical connecting condition between the certain object A and the other object B so as to spatially separate (or remove) the certain object A from the other object B, but the method of the present invention also covers weakening or breaking the connecting portion as described above prior to resulting in detachment, and it is mainly characterized by this feature. Thus, the detaching method of the present invention may also be referred to as a weakening method or a breaking method of the connecting portion.

The hydrogen storage metal material changes in its volume because of a temperature and a hydrogen pressure of an atmosphere in which the hydrogen storage metal material is located, depending on a kind of the hydrogen storage metal material. Accordingly, a condition for expansion or contraction of the hydrogen storage metal material in the form of particles so as to weaken (or break) the connecting portion as described above, i.e. an atmosphere having a hydrogen occlusion condition which is sufficient to increase a volume of the hydrogen storage metal material or an atmosphere having a hydrogen release condition which is sufficient to decrease a volume of the hydrogen storage metal material (of which meaning is substantially reverse to the meaning of "an atmosphere having a hydrogen occlusion condition which is sufficient to increase a volume of the hydrogen storage metal material in the form of particles" as explained before, and which is used to mean such explanations in which "decrease" is applied in place of "increase" and "release" is applied in place of "occlusion") varies depending on the kind of the hydrogen storage metal material. Using this, it is possible to make atmospheres different from one another, each having a hydrogen occlusion (or release) condition which is sufficient to increase (or decrease) a volume of the hydrogen storage metal material for causing weakening and preferably breaking of the connecting portion as described above by varying the kind of the hydrogen storage metal material which is contained in the connecting material.

On the basis of a state where the hydrogen storage metal material stores substantially no hydrogen, a hydrogen storage metal material such as $LaNi_5$ significantly expands (e.g. up to at least about 1.3 times its volume) within a temperature range from room temperature (e.g. about 15 to 25° C.) to 150° C. and a pressure range of 0.1 to 10 MPa. Especially, a ratio of change of its volume is large when the hydrogen storage metal material is hearted to at least 100° C. from room temperature within such pressure range. Also, a hydrogen storage metal material such as $LaNi_{4.5}Al_{0.5}$ also significantly expands (e.g. up to at least about 1.3 times its volume) within a temperature range from room temperature (e.g. about 15 to 25° C.) to 150° C. and a pressure range of 0.1 to 10 MPa. However, it should be noted that expansion behaviors of these metal materials do not depend on a pressure and a temperature in the same manners, and that each metal material expands a distinctive degree (or ratio) at a specific temperature and pressure condition which depends on its kind.

For instance, it is assumed that two kinds of connecting portions are formed by using connecting materials (M-1 and M-2), respectively, which contain different hydrogen storage metal materials (X-1 and X-2), respectively, for connecting two kinds of certain objects (A-1 and A-2), respectively. With this assumption, it is possible to expand only the hydrogen storage metal material X-1 of the connecting material M-1 for connecting the certain object A-1 so as to weaken only the connecting portion of the connecting material M-1, and then to detach only the certain object A-1 with the help of a mechanical action if necessary; and thereafter to expand the hydrogen storage metal material X-2 of the connecting material M-2 for connecting the certain object A-2 so as to weaken the connecting portion of the connecting material M-2 and then to detach the certain object A-2 with the help of a mechanical action if necessary. As a result, it is possible to detach one kind of the certain object A-1 separately from the other kind of the certain object A-2, or to detach the certain objects A-1 and A-2 selectively. Similarly to the above, it is also possible to selectively and separately detach each of three or more kinds of certain objects A from other object B to which the certain objects A are connected by virtue of three or more kinds of the connecting materials, respectively, wherein the number of the kinds of the connecting material is same as that of the certain objects A, and the connecting materials contain different kinds of hydrogen storage metal materials, respectively.

As an example, a certain object A-1 is connected to other object B by virtue of a connecting material which contains $Ti_{0.88}Zr_{0.12}Mn_{1.0}V_{0.4}Ni_{0.6}$ as a hydrogen storage metal material and Sn—Ag—Cu as a solder material, and a certain object A-2 is connected to the same other object B by virtue of a connecting material which contains $LaNi_5$ as a hydrogen storage metal material and Sn—Ag—Cu as a solder material (it is noted that these hydrogen storage metal materials stores no hydrogen). These resultant objects are maintained at about 30° C. in an atmosphere having a hydrogen pressure of 0.1 to 1 MPa at first. At this stage, though both of the hydrogen storage metal materials store hydrogen, a degree of expansion resulting from such storage in $Ti_{0.88}Zr_{0.12}Mn_{1.0}V_{0.4}Ni_{0.6}$ is much larger than that of $LaNi_5$, so that a connecting portion weakening by expansion is substantially caused only in the connecting portion with the certain object A-1. Accordingly, with respect to $Ti_{0.88}Zr_{0.12}Mn_{1.0}V_{0.4}Ni_{0.6}$ only, such atmosphere at 30° C. corresponds to an atmosphere having a hydrogen occlusion condition which is sufficient to increase its volume. Thereafter, a hydrogen pressure of the atmosphere is decreased while maintaining a temperature of 30° C., followed by being increased again so as to repeat expansion and contraction of particles of $Ti_{0.88}Zr_{0.12}Mn_{1.0}V_{0.4}Ni_{0.6}$ for enhancing weakening of the connecting portion, if this is necessary. At this stage, particles of $LaNi_5$ may expand and contract in the connecting portion with the certain object A-2, but the degrees of this expansion and contraction are substantially negligible. As a result, in this situation, the connecting portion with the object A-1 is weakened, and on the other hand, the connecting portion with the object A-2 is not weakened, so that it is possible to detach the object A-1 alone when an external force (for example, a mechanical force by blushing or ultrasonic vibration) is applied to an entirety of the other object B.

Next, the temperature of the atmosphere is increased to about 100° C. while maintaining the hydrogen pressure so as to expand the particles of $LaNi_5$, so that the connecting portion with the certain object A-2 is weakened. Similarly to the above, it is possible to detach the certain object A-2 by repeating expansion and contraction if necessary and adding an external force. With respect to $LaNi_5$, such atmosphere at 100° C. corresponds to an atmosphere having a hydrogen occlusion condition which is sufficient to increase its volume.

It is noted that sufficient weakening (or breaking) can be attained with only one time expansion in some cases, and a combination of expansion and contraction has to be repeated plural times, for example ten times or more, and preferably 20 times or more in other cases depending on a state of the connecting portion (e.g. a connecting strength, a structure of the connecting portion and the like). In addition, the connecting portion is completely broken by itself upon being weakened (namely, the certain object is fully separated from the other object) in some cases, and in other cases, completely breaking is attained by an external force when a connecting portion is not completely broken by itself.

As described above, when two kinds of the certain objects (A-1 and A-2) are connected to the same other object (B) using two kinds of the connecting materials (M-1 and M-2), respectively, of which atmospheres each having a hydrogen occlusion condition which is sufficient to increase a volume of a hydrogen storage metal material (atmosphere D-1 and atmosphere D-2) are different, only a connecting portion formed by one connecting material (M-1) is substantially weakened without substantially weakening a connecting portion formed by the other connecting material (M-2) by exposing the other object B to the atmosphere D-1, so that the certain object (A-1) which is connected by virtue of such weakened connecting portion is selectively detached, and thereafter, a connecting portion formed by the other connecting material (M-2) is substantially weakened by exposing the other object B to the atmosphere D-2, so that only the certain object (A-2) which was connected by virtue of such weakened connecting portion is selectively detached, and therefore, selective detachment can be realized.

By applying such selective detachment, it is possible to selectively detach three or more kinds of the certain objects A by using three or more kinds of the connecting material, each having a different hydrogen occlusion condition which is sufficient to increase a volume of a hydrogen storage metal material contained in the connecting portion. The selective detachment as described above is preferable because it makes possible detachment and recovery of certain objects depending on the kind of the certain objects.

Thus, the present invention provides a method for detaching at least two certain objects A-1 and A-2 from other object B to which the at lest two certain objects A-1 and A-2 are connected by virtue of connecting portions formed by the connecting materials of the present invention, respectively, wherein a hydrogen storage metal material x-1 in the form of particles, which is contained in the connecting material which forms the connecting portion to connect at least one certain object A-1 to the other object B, is different from a hydrogen storage metal material x-2 in the form of particles, which is contained in the connecting material which forms the connecting portion to connect the other at least one certain object A-2 to the other object B, and wherein the hydrogen storage metal materials x-1 and x-2 are selected such that a volume of the latter hydrogen storage metal material x-2 does not substantially increase in an atmosphere D-1 having a hydrogen occlusion condition which is sufficient to increase a volume of the former hydrogen storage metal material x-1, and an atmosphere D-2 having a hydrogen occlusion condition which is sufficient to increase a volume of the latter hydrogen storage metal material x-2 is different from the atmosphere D-1, and which method comprises (a) exposing the other object B to the former atmosphere D-1 and (b) exposing the other object B to the latter atmosphere D-2.

Therefore, the present invention provides a connecting method for connecting certain objects A-1 and A-2 to other object B by using connecting materials of the present invention, respectively, which method can realize the detaching method as described above, and in which connecting method a hydrogen storage metal material x-1 contained in the connecting material which is used for connecting at least one certain object A-1 is different from a hydrogen storage metal material x-2 contained in the connecting material which is used for connecting the other at least one certain object A-2.

For example, the connecting material of the present invention is preferably used as a material which is used for connecting an electronic component as the certain object A to a circuit board as the other object B. That is, the connecting material of the present invention can form a connecting portion for electrically and mechanically connecting the certain object A to the other object B by melting solder material contained in the connecting material. Thus, the present invention provides a connecting method according to the connecting method as described above, wherein the certain object is an electronic component and the other object is a circuit board. Furthermore, the preset invention provides a method of producing an electronic circuit board by mounting an electronic component onto a circuit board, wherein the connecting material of the present invention as described above is used upon mounting the electronic component.

In addition, the present invention provides a method of detaching an electronic component from a circuit board to which the electronic component is connected by virtue of a connecting portion which is formed by using the connecting material according to the present invention (or a method of weakening such connecting portion), wherein the hydrogen storage metal material is in a state of storing substantially no hydrogen, and which method comprises subjecting (or exposing) the connecting portion to an atmosphere having a hydrogen occlusion condition so as to make the hydrogen storage metal material store (or occlude) hydrogen. Preferably, the atmosphere having the hydrogen occlusion condition is an atmosphere having a hydrogen occlusion condition which is sufficient to increase a volume of the hydrogen storage metal material, so that the hydrogen storage metal material in the form of particles is increased in its volume.

In this method, in a case where the connecting material contains the hydrogen storage metal material which stores substantially no hydrogen (or stores a small amount of hydrogen), when the connecting portion is located in an atmosphere which makes the hydrogen storage metal material expand (e.g. an atmosphere having a higher pressure of hydrogen), i.e. the atmosphere having the hydrogen occlusion condition which is sufficient to increase a volume of the hydrogen storage metal material, or in an atmosphere which makes the hydrogen storage metal material shrink after it has expanded (or an atmosphere which repeats such expansion and shrinkage) so as to expand or expand and shrink (or repeat the expansion and the shrinkage), respectively, the connecting portion is weakened, and preferably broken as a result.

Furthermore, the selective detaching of the certain object A as described above is effective when plural kinds of electronic components are connected to a circuit board using the connecting materials of the present invention, and electronic components of the same kind are to be detached and recovered.

Thus, in a preferred embodiment, plural connecting materials each containing a different hydrogen storage metal material are prepared, one specific kind of connecting material is used for connecting one specific kind of electronic component, and a certain other kind of connecting material is used for connecting another kind of electronic component. Thus, an electronic circuit board is produced by using a different connecting material for each kind of electronic component upon connecting plural kinds of electronic components to the circuit board.

In this way, a certain kind of electronic component can be readily detached from an electronic circuit board by locating the circuit board in an atmosphere which weakens only a connecting portion associated with the certain kind of electronic component so as to weaken only such connecting portion of the certain kind of electronic component, since atmospheres each having a hydrogen occlusion condition which is sufficient to increase a volume of a hydrogen storage metal material contained in a connecting portion are different.

Thus, in accordance with another aspect of the present invention, there is provided a method for connecting certain object A to other object B, and in particularly a method of producing an electronic circuit board for connecting an electronic component(s) to a board (or a substrate) while using the connecting material as described above. More particularly, there is provided a method for connecting plural kinds of certain objects A, e.g. electronic components, to a single other object B, e.g. a circuit board while using plural kinds of connecting materials, each containing a different kind of hydrogen storage metal material.

In a particularly preferred embodiment, there is provided a method for breaking a connecting condition where plural kinds of certain objects A are connected to other object B by virtue of connecting portions which are formed respectively by plural kinds of the connecting materials of the present invention as described above, characterized in that the connecting portions are exposed to a first atmosphere where a hydrogen storage metal material expands so that the connecting portion between one kind of the certain object A-1 and the other object B is weakened, and thereafter the connecting portions are exposed to a second atmosphere where another hydrogen storage metal material expands so that the connecting portion between another kind of the certain object A-2 and the other object B is weakened. In this way, it is possible to selectively detach and recover one certain specific object A-1, e.g. a specific electronic component separately from the other certain object A-2.

A detaching method for an electronic circuit board of the present invention comprises locating a circuit board having a connecting portion formed by a connecting material which includes a hydrogen storage metal material, storing substantially no hydrogen, in an atmosphere having a predetermined temperature and hydrogen pressure, especially in an atmosphere having a hydrogen occlusion condition which is sufficient to increase a volume of the hydrogen storage metal material. Therefore, the hydrogen storage metal material is substantially expanded.

In a preferred embodiment, a detaching method of the present invention further comprises applying an external force (such as an impulsive force, a force due to shaking or the like) to a weakened connecting portion, in addition to weakening the connecting portion as described above, so that the connecting portion is further weakened, and preferably broken. Such force can also be applied, for example, by directly or indirectly applying a force to the certain object A, or thus weakened connecting portion, by use of another element (e.g. a percussion machine, an air blower or the like), or by vibrating the other object B (e.g. vibrating by an ultrasonic vibrating machine).

EMBODIMENTS OF THE INVENTION

Hereinafter, embodiments of the present invention will be described in detail while referring to the drawings. FIG. 1 schematically shows an elevational view of an electronic circuit board where an electronic component 2 as the certain object A is connected to a top surface of a circuit board 1 as the other object B by virtue of a connecting portion 3 formed by using a connecting material of the present invention. More particularly, an electrode 2' of the electronic component 2 is connected to an electrode 4 formed on the circuit board 1 via the connecting portion 3. It is noted that FIG. 1 is shown in a schematically simplified manner for readily understanding an interior of the connecting portion.

The connecting material of the present invention comprises a solder material, and a hydrogen storage metal material in the form of particles and other necessary components, and the connecting portion 3 is formed by heating such connecting material to a temperature which is equal to or higher than a melting temperature of the solder material followed by cooling it. The connecting portion 3 is substantially made of hydrogen storage metal material 5 in the form of particles, and solder material 6, as shown in the drawing. Of course, when the connecting material comprises a component which can exist after formation of the connecting portion, such component may be present in the connecting portion 3.

As described above, when the connecting portion is formed by using the connecting material of the present invention, the particles 5 of the hydrogen storage metal material are likely to localize at an exposed surface of the connecting portion 3 (i.e. a part of the connecting portion 3 which is adjacent to its ambient atmosphere). As shown in the drawing, a relatively large amount of the particles 5 of the hydrogen storage metal material exists at the exposed surface of the connecting portion, though the particles 5 of the hydrogen storage metal material may also dispersedly exist inside the connecting portion. As a result, the connecting portion is in a state where the hydrogen storage metal material can readily occlude hydrogen (when located in a hydrogen atmosphere), while ensuring a connecting strength which is close to an inherent strength of the solder material.

The hydrogen storage metal material particles 5 which are used for the connecting material of the present invention may have any suitable form, and preferably have such a form so that they can be mixed with solder material sufficiently and readily handled. In the shown embodiment, the particles having a spherical form are mainly shown, but the particles may have a elongate form, an oval form or an irregular form 5' as also shown as other examples. For instance, hydrogen storage metal material particle 5 may be shaped as a granule, and more particularly, it has a spherical shape having a diameter of, for example, about 100 μm or less, preferably 75 μm or less, and more preferably 10 to 30 μm. In another embodiment, the particle may have a spheroidal form. In yet another embodiment, the particle can be a rod form, a flake form, a fibrous form or the like.

As the hydrogen storage metal material, one which is known as a hydrogen storage metal material and varies in its volume depending on a temperature and a pressure can be used. For example, alloys such as $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$ and $Mg_2Ni$, metal elements such as Pd, V, Ti and Zr and the like are listed as such material. However, the present invention is not limited to these examples, and a material which varies in its volume depending on a temperature and a pressure similarly to the hydrogen storage metal material can also be used, so that a material which may also store a substance other than hydrogen can be used.

In the connecting material of the present invention, a material which is known as a solder material in the art can be used for the solder material. The solder material is preferably in the form of particles (or powder) similarly to the hydrogen storage metal material as described above. The solder material can be one comprising, for example, an Sn—Ag based alloy, an Sn—Bi based alloy, an Sn—Ag—Bi based alloy, an Sn—Ag—Bi—In based alloy, an Sn—Cu based alloy or an Sn—Pb based alloy.

In addition, the connecting material of the present invention may comprise other substances in addition to the solder material, such as a flux containing rosin, an activator and a solvent. Thus, for example, a blend of the hydrogen storage metal material with a cream solder can be used as the connecting material of the present invention. In this case, the connecting material of the present invention can be in the form of a blend of the hydrogen storage metal material with a cream solder, which blend results from mixing solder particles having a diameter of 10 to 50 μm, and preferably 10 to 30 μm, with a flux containing rosin, the activator and the solvent. It is noted that the solder material is preferably lead-free, though it may be a conventional solder which contains lead.

As to materials of the board 1, as the other object B, as well as the electrode 4 and wiring which are formed on the board 1, materials which are known as those materials in the art can be used. For example, the connecting material of the present invention can be applied to a circuit board which is formed from a substrate material such as glass epoxy resin, phenolic paper or the like, as well as an electrode/wiring material such as copper or the like.

On the other hand, the certain object A is not limited as long as it is to be connected to the other object B. As to an electronic component as the certain object A, a capacitor 2 is shown in FIG. 1 as one example, but the present invention is not limited to such. Any other suitable electronic component, for example, one of other chip components such as transistors, inductors and capacitors, QFP components, CSP components, and connectors can be used as the electronic component.

Hereinafter, the present invention will be described in more detail with reference to a method of producing an electronic circuit board as described above, and more particularly, a method of producing an electronic circuit board by connecting an electronic component as an example. It is noted that a connection between the certain object A, such as an electronic component, and the other object B, such as a circuit board is a connection between elements acting as electrodes of these objects.

At first, particles 5 of the hydrogen storage metal material which store substantially no hydrogen, the solder material 6 and other necessary component(s) (such as rosin, a flux and the like) are blended in an atmosphere which is isolated from hydrogen so as to obtain the connecting material of the present invention in the form of a paste. In another embodiment, the connecting material may be obtained by blending the hydrogen storage metal material with a cream solder which is commercially available. At this stage, a blending ratio of the hydrogen storage metal material in the form of particles is, for example, 5 to 70% by weight, preferably 20 to 50% by weight, and more preferably 20 to 40% by weight, on the basis of the solder material as 100% by weight in the connecting material, and an amount of the hydrogen storage metal material can be properly selected considering a connecting strength needed by the connecting portion. On such blending, an amount of the flux can be adjusted, if necessary, so that a desired viscosity of the connecting material is attained in order to make application of the connecting material easy.

Next, a circuit board 1, such as a printed board, on which an electrode 4, and a wiring pattern (not shown) connected to the electrode 4, are preformed at predetermined portions is prepared. The connecting material obtained as described above is supplied onto the electrode 4 according to a screen printing method or the like. An electronic component 2 is located on this resultant board 1 such that an external electrode 2' of the electronic component 2 is in contact with the connecting material on the electrode 4.

Then, the board 1 is heated to a temperature which is equal to or higher than a melting point of the solder material 6 (e.g. 200 to 240° C.) to melt the solder material 6, and is subsequently cooled to room temperature to solidify the solder material 6. In this way, the connecting portion 3 is formed as schematically shown in FIG. 1. It is noted that the melted solder material 6 rises along a surface of the external electrode 2' on account of wetting in relation to the external electrode 2' of the electronic component 2, and solidifies as it is. On the other hand, the hydrogen storage metal material particles 5 are not melted and are included in the solder material 6 in a condition that the particles are likely to localize at an exposed surface of the solder material in a relatively large number, while also be dispersed inside the connecting portion as shown in FIG. 1.

Figure 2:
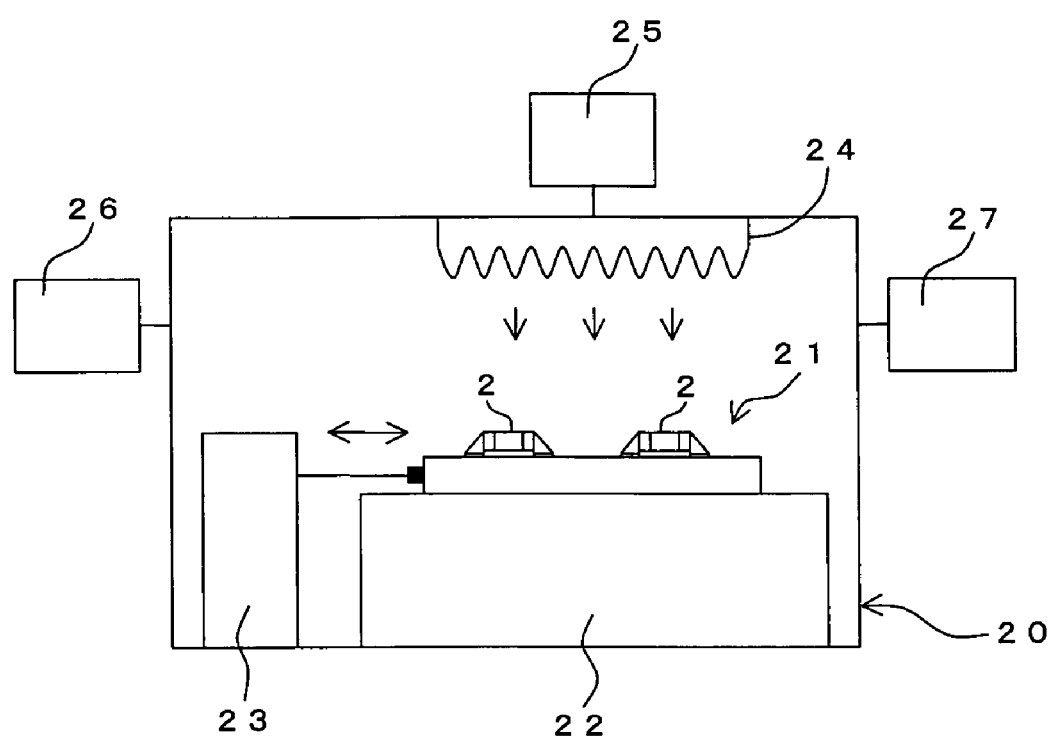
FIG. 2 shows a schematic view for explanation of a detaching method of an electronic component which is connected by virtue of a connecting material of the present invention.

A method of detaching an electronic component from the electronic circuit board as described above will be explained while referring to FIG. 2. An electronic circuit board 21, provided with two capacitors as electronic components 2, is set on a table 22 and connected to a shaker 23. The shaker 23 and the table 22 are located in a chamber 20 which can maintain a pressurized hydrogen atmosphere.

Then, the chamber 20 is filled with hydrogen by supplying hydrogen via a hydrogen supplying apparatus 26. The atmosphere in the chamber 20 can be either an atmosphere including only hydrogen or an atmosphere including not only hydrogen but also other gas(es), such as a gaseous component of $CO$, $O_2$, $H_2O$ and the like. It is possible to supply hydrogen in a flow system while conducting this detaching method.

If necessary, the electronic circuit board 21 is heated by heating the atmosphere in the chamber by operating a heater 24 and a blower 25. A temperature of the electronic circuit board 21 is in a range from room temperature to 200° C., preferably from room temperature to 150° C., and more preferably from room temperature to 100° C.

A temperature and a hydrogen pressure (or a partial pressure of hydrogen) of the atmosphere in the chamber 20 is set in order to achieve an atmosphere having a hydrogen occlusion condition which is sufficient to increase a volume of the hydrogen storage metal material depending on a kind of the hydrogen storage metal material contained in the connecting portion. Pressure of the atmosphere is increased to a predetermined value by virtue of a pressure generating apparatus 27. The hydrogen pressure of the chamber, i.e. the hydrogen pressure of the atmosphere to which the electronic circuit board 21 (thus, the connecting portion) is exposed is generally in a range of 0.01 to 10 MPa, preferably from 0.1 to 8 MPa. Such hydrogen pressure can be continuously maintained at a predetermined value for a certain period, or it can be changed periodically between a predetermined value and a value lower than the predetermined value (e.g. a pressure which is close to a vacuum). In the latter case, it is preferable to maintain the pressure at each value for a predetermined period, so that weakening of the connecting portion is readily accelerated since the hydrogen storage metal material in the form of particles repeats expansion and shrinkage.

In this way, the connecting strength of the connecting portion is lowered, namely weakened, and preferably the connecting portion is broken. It is contemplated that such weakening and breaking are caused by cracks which are generated around the particles of the hydrogen storage metal material in the connecting portion since the hydrogen storage metal material changes its volume, and more particularly, the hydrogen storage metal material particles expand by occluding hydrogen or shrink by releasing hydrogen which has been once stored therein, depending on the atmosphere in the chamber.

It is noted that in order to promote weakening and breaking of the connecting portion, it is possible to apply a force to the connecting portion of the electronic circuit board, if necessary, by shaking the electronic circuit board 21 by virtue of the shaker 23, so that the electronic component 2 can be detached. Alternatively, an ultrasonic vibrator may be used in place of or in addition to the shaker 23.

Figure 3:
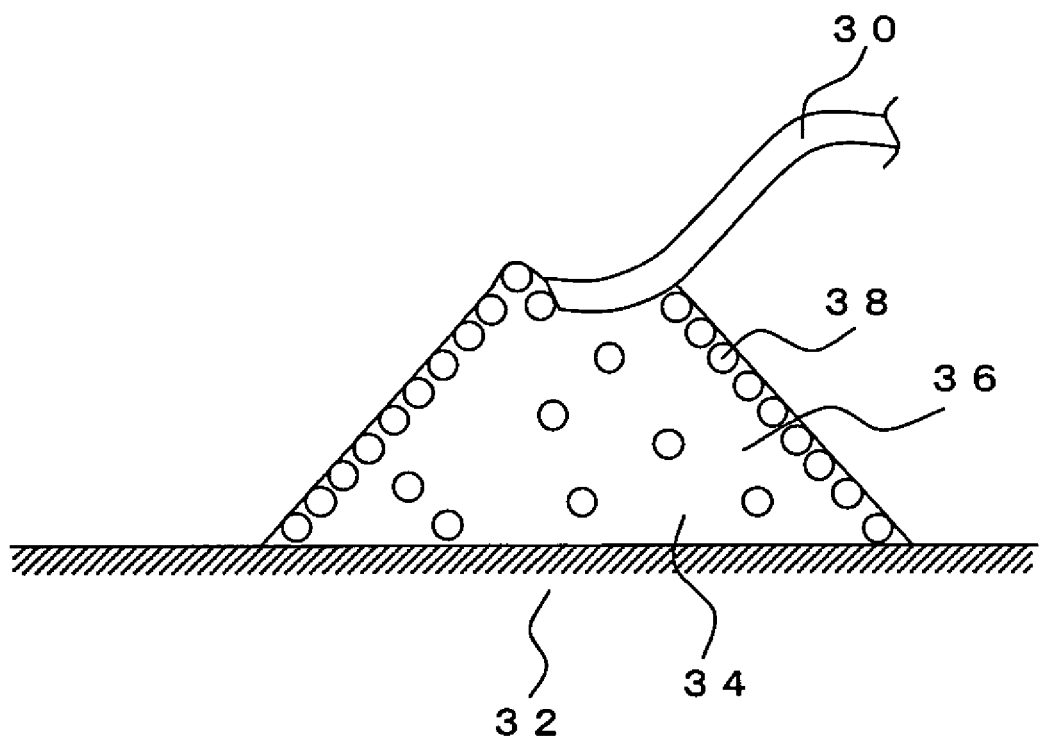
FIG. 3 shows a schematic view of an electronic circuit board having a connecting portion formed by using a connecting material of the present invention, wherein the connecting portion is shown in its cross sectional view for a better understanding of its interior.

Another embodiment of the connecting portion which is formed by the connecting material of the present invention is schematically shown in FIG. 3. FIG. 3 schematically shows that a lead 30 of an electronic component (not shown) is connected to a circuit board 32 via a connecting portion 34. Similarly to the embodiment shown in FIG. 1, the connecting portion 34 is shown in a state wherein hydrogen storage metal material 38 in the form of particles exists in a phase of solder material 36 as a continuous phase. It should be noted that all of the particles of the hydrogen storage metal material 38 are not shown in FIG. 3, and the particles in the vicinity of an exposed surface, and the particles inside the connecting portion, are exemplary shown in FIG. 3 for more readily understanding the feature of uneven distribution of the particles of the hydrogen storage metal material, which are likely to gather at the exposed surface of the connecting portion.

Figure 4:
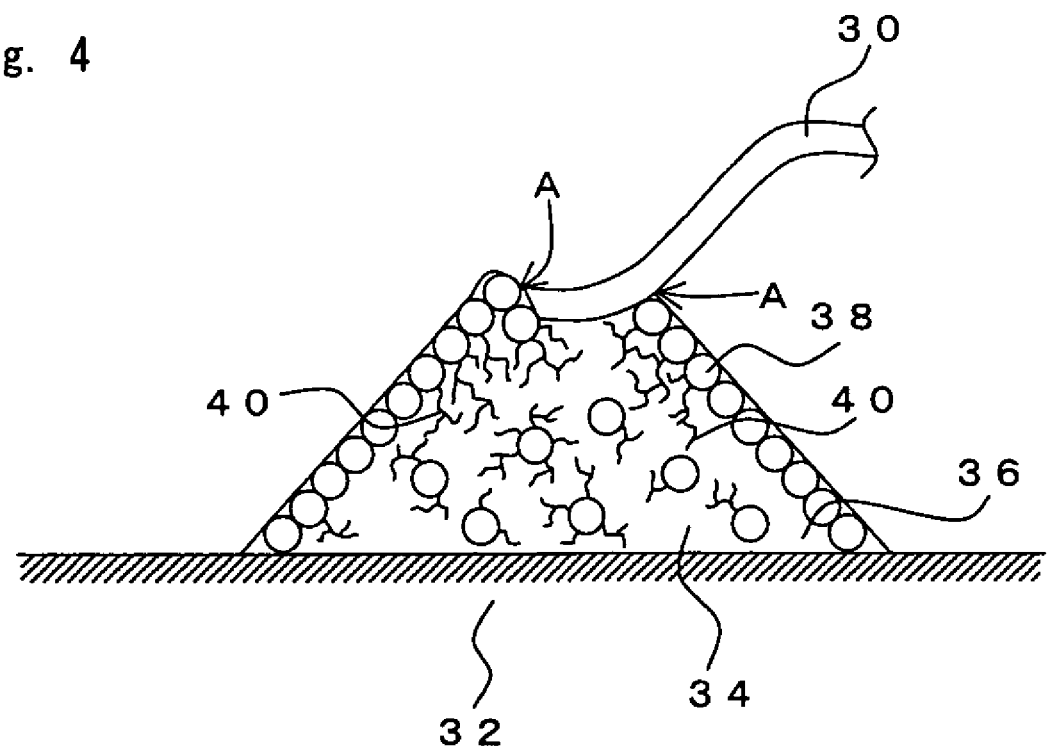
FIG. 4 shows a schematic view of the electronic circuit board of FIG. 3 when a hydrogen storage metal material in the connecting portion of FIG. 3 has expanded, wherein the connecting portion is shown in its cross sectional view for a better understanding of its interior.

In a manner similar to FIG. 3, a circuit board 32 is schematically shown in FIG. 4, wherein the hydrogen storage metal material in the form of particles increases its volume when the circuit board as shown in FIG. 3 is exposed to an atmosphere having a hydrogen storage condition which is sufficient to increase the volume of the hydrogen storage metal material. In the shown embodiment, it is shown that the hydrogen storage metal material 38 in the form of particles expands so that a diameter of the particles is increased. Furthermore, it is shown that cracks of the solder material 36 are generated by such expansion around the particles. It should be noted that cracks which are generated in relation to only some particles are shown for merely exemplary purpose, and cracks which are generated in relation to all particles are not shown in FIG. 4.

As readily seen while referring to FIG. 4, the particles existing in the vicinity of a boundary between the lead 30 and the connecting portion 34 (which is shown as a portion pointed to by A) also provide cracks to the continuous phase of the solder material by their expansion (the cracks as to such particles in the vicinity of the boundary are omitted for clarity). Such cracks in the vicinity of the boundary affect the connecting strength for the lead 30 to a great extent, differently from the cracks which are formed inside the connecting portion. Especially, the cracks in the vicinity of the boundary cause partial destruction of that portion of the solder material, and when an external force is applied to that portion, the lead 30 may be removed from the connecting portion by a blast through such cracks which functions like a trigger. As a result, the lead 30 can be detached while the connecting portion 34 remains on the board 32 so that the lead 30 carries no solder material or a small amount of solder material thereon.

According to the above, it is possible to recover an electronic component(s) which carries a relatively small amount of an attached material thereto, which is derived from the connecting material, when the electronic component is detached from an electronic circuit board for its recovery, so that it is possible to make reuse of this recovered electronic component easier. On the other hand, the material derived from the connecting material remains on the circuit board in a large amount, but when such circuit board is heated to a high temperature so as to melt the solder material, it is also possible to remove the material which is derived from the connecting material, including the hydrogen storage metal material, from the circuit board and to recover the circuit board with almost no damage thereto resulting from heating. Thus, it is possible to separate and reuse not only the electronic component(s) but also the circuit board more easily.

As described above, it is possible to detach an electronic component(s) from an electronic circuit board and to recover the electronic component and the circuit board. Thus recovered electronic component and circuit board have almost no damage.

According to the method of the present invention as described above, a connecting strength of a connecting portion can be reduced simply by exposing the connecting portion to an atmosphere having a predetermined temperature and pressure, and therefore, there is provided a connecting material which is readily detachable. According to the present invention, the hydrogen storage metal material co-exists with solder material in the connecting portion so that the hydrogen storage metal material is placed simultaneously with the solder material in a conventional step of supplying a solder material upon mounting an electronic component(s), so that a complicated additional step is not required in comparison with a conventional mounting process.

Furthermore, hydrogen storage metal materials, each of which has a different characteristic as to temperature and pressure dependency of its volume can be used for the connecting materials of the present invention. Each of the connecting materials which are obtained as described above has a different temperature and pressure condition on which its connecting strength is effectively reduced, i.e. an atmosphere having a hydrogen occlusion condition which is sufficient to increase a volume of the hydrogen storage metal material in the form of particles. Thus, it is possible to detach and selectively recover only particular electronic components by using such different kinds of connecting materials depending on kinds of electronic components, and adequately selecting an atmosphere having the temperature and pressure conditions depending on characteristics of the connecting material, respectively, and therefore there is advantage in that no additional classification of the electronic components is required after recovery thereof.

EXAMPLES

A connecting material of the present invention was produced by blending $Ti_{0.88}Zr_{0.12}Mn_{1.0}V_{0.4}Ni_{0.6}$, (which has a particle diameter of not more than 75 μm) as a hydrogen storage metal material in the form of particles which store no hydrogen, with a commercially available cream solder (PS33BR-450A-F83 manufactured by Harima Chemicals, Inc.; composition of solder material: Sn-3Ag-2.5Bi-2.5In; diameter of solder material particle: 20 to 40 μm; flux content: 11% by weight). It is noted that a blending ratio of the hydrogen storage metal material was 41.7% by weight on the basis of the solder material contained in the cream solder.

Then, the connecting material which was produced as described above was applied to an electrode formed on a circuit board (which is a glass epoxy substrate for evaluation of a reflow soldering) according to a screen printing method, and thereafter, an electronic component (a multi layer ceramic capacitor) was set on the circuit board in order to locate an electrode of the electronic component on the connecting material.

This resultant circuit board was heated to melt a solder material in a reflow soldering oven, and then it was cooled to form a connecting portion between an electrode on the circuit board and the electrode of the electronic component. In this way, an electronic circuit board on which the electronic component was mounted was produced.

Before the connecting portion was formed, the connecting material as described above was like a cream solder and had an appearance in which blackish particles of the hydrogen storage metal material were dispersed. After the connecting portion was formed as described above, an entirety of an exposed surface of the connecting portion had a blackish brown appearance. Thus, it has been confirmed that the particles of the hydrogen storage metal material tend to gather at the exposed surface of the connecting portion when the connecting portion has been formed by using the connecting material of the present invention.

The electronic circuit board which was produced as described above was located inside a hydrogen chamber (which is made of stainless steel) to expand the particles of the hydrogen storage metal material in an atmosphere of hydrogen. The atmosphere had a hydrogen pressure of 8 MPa and a temperature of 25° C. This atmosphere was maintained for 60 minutes. Then, the hydrogen pressure in the chamber was reduced to 0.1 Pa by discharging hydrogen therefrom while maintaining the temperature, and such conditions of the hydrogen pressure and the temperature were maintained for 60 minutes to shrink the particles of the hydrogen storage metal material which were previously expanded as above. Thereafter, the hydrogen pressure in the chamber was raised and returned to 8 MPa again by supplying hydrogen to the chamber while maintaining the above temperature to again expand the particles of the hydrogen storage metal material which were previously shrunk as above.

As described above, the electronic circuit board was subjected to cycles where supply of hydrogen to the chamber and discharge of hydrogen therefrom were conducted repeatedly while maintaining a temperature of 25° C., and a connecting strength of the connecting portion was tested after it was subjected to a predetermined number of cycles (it is noted that one cycle consisted of one expansion and then one shrinkage).

As a result, it was found that a shearing strength of the connecting portion was changed from 1.47 kgf at its formation to 0.50 kgf after forty cycles (i.e. a reduction ratio of 66%). Thus, the connecting strength was sufficiently weakened, and the electronic component was in a state where the electronic component could be readily detached from the circuit board manually.

In addition, a connecting material comprising 19.2% by weight of $Ti_{0.88}Zr_{0.12}Mn_{1.0}V_{0.4}Ni_{0.6}$ on the basis of a solder material was produced similarly to the above, and also tests were carried out similarly. A shearing strength of the connecting portion was reduced by about 40%.

Furthermore, connecting materials comprising $LaNi_{4.5}Al_{0.5}$ and $LaNi_5$, respectively, (which respectively comprised 15.6% by weight and 29.9% by weight of such hydrogen storage metal material on the basis of a solder material) were produced similarly to the above and tested according to the above manner. Shearing strengths of the connecting portions were reduced by about 30% and 40%, respectively.

What is claimed is:

1. A method of connecting a certain object to another object, comprising:
   heating a connecting material located between an electronic component and a circuit board, wherein said connecting material includes
   (i) solder material, and
   (ii) dispersed particulate hydrogen storage metal material able to occlude hydrogen and selected from the group consisting of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$, V and Zr,
   such that said solder material melts; and
   cooling said connecting material such that said solder material solidifies, whereby a connection portion is formed which interconnects said electronic component and said circuit board.

2. The method according to claim 1, wherein said hydrogen storage metal material is capable of changing in volume in response to a temperature and/or a hydrogen pressure of an atmosphere in which said hydrogen storage metal material is located.

3. The method according to claim 1, wherein said hydrogen storage metal material is capable of being in a state in which no hydrogen is stored by said hydrogen storage metal material.

4. The method according to claim 1, wherein said solder material comprises a cream solder, and said particulate hydrogen storage metal material is dispersed throughout said cream solder.

5. A method of producing an electronic circuit board, comprising:
   heating a first connecting material located between a first electronic component and a circuit board, with said first connecting material including
   (i) solder material, and
   (ii) dispersed particulate first hydrogen storage metal material able to occlude hydrogen,
   such that said solder material melts;
   cooling said first connecting material such that said solder material solidifies, whereby a first connection portion is formed which interconnects said first electronic component and said circuit board;
   heating a second connecting material located between a second electronic component and said circuit board, with said second connecting material including
   (i) solder material, and
   (ii) dispersed particulate second hydrogen storage metal material able to occlude hydrogen,
   such that said solder material melts; and
   cooling said second connecting material such that said solder material solidifies, whereby a second connection portion is formed which interconnects said second electronic component and said circuit board,
   wherein said first hydrogen storage metal material is different than said second hydrogen storage metal material.

6. The method according to claim 5, wherein each of said first and second hydrogen storage metal material is capable of changing in volume in response to a temperature and/or a hydrogen pressure of an atmosphere in which said each of said first and second hydrogen storage metal material is located.

7. The method according to claim 6, wherein said first electronic component is to be recovered separately from said second electronic component upon detaching said first and second electronic components from said circuit board.

8. The method according to claim 5, wherein each of said first and second hydrogen storage metal material is selected from the group consisting of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$, Pd, V, Ti and Zr.

9. The method according to claim 8, wherein said first electronic component is to be recovered separately from said second electronic component upon detaching said first and second electronic components from said circuit board.

10. The method according to claim 5, wherein each of said first and second hydrogen storage metal material is capable of being in a state in which no hydrogen is stored by a respective said each of said first and second hydrogen storage metal material.

11. The method according to claim 10, wherein said first electronic component is to be recovered separately from said second electronic component upon detaching said first and second electronic components from said circuit board.

12. The method according to claim 5, wherein said solder material comprises a cream solder, said first connecting material comprises said particulate first hydrogen storage metal material dispersed throughout said cream solder, and said second connecting material comprises said particulate second hydrogen storage metal material dispersed throughout said cream solder.

13. The method according to claim 12, wherein
said first electronic component is to be recovered separately from said second electronic component upon detaching said first and second electronic components from said circuit board.

14. The method according to claim 5, wherein
said first electronic component is to be recovered separately from said second electronic component upon detaching said first and second electronic components from said circuit board.

15. A method of detaching a certain object from another object, comprising:
subjecting to an atmosphere having a hydrogen occlusion condition, a connecting material interconnecting a certain object and another object, with said connecting material including
(i) solder material, and
(ii) dispersed particulate hydrogen storage metal material, storing substantially no hydrogen, and able to occlude hydrogen,
such that said particulate hydrogen storage metal material occludes hydrogen, thereby increasing a volume of said particulate hydrogen storage metal material.

16. The method according to claim 15, wherein
said hydrogen occlusion condition comprises a temperature and/or a hydrogen pressure of said atmosphere.

17. The method according to claim 16, wherein
increasing a volume of said particulate hydrogen storage metal material results in said connecting material being weakened in the vicinity of said particulate hydrogen storage metal material.

18. The method according to claim 17, further comprising:
applying an external force to the weakened connecting material.

19. The method according to claim 16, wherein
said certain object comprises an electronic component, and
said another object comprises a circuit board.

20. The method according to claim 16, wherein
said atmosphere has a hydrogen pressure within a range of from 0.01 Mpa to 10 Mpa.

21. The method according to claim 16, wherein
said atmosphere has a temperature within a range of from room temperature to 150° C.

22. The method according to claim 15, wherein
said hydrogen storage metal material is selected from the group consisting of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$, Pd, V, Ti and Zr.

23. The method according to claim 22, wherein
increasing a volume of said particulate hydrogen storage metal material results in said connecting material being weakened in the vicinity of said particulate hydrogen storage metal material.

24. The method according to claim 23, further comprising:
applying an external force to the weakened connecting material.

25. The method according to claim 22, wherein
said certain object comprises an electronic component, and
said another object comprises a circuit board.

26. The method according to claim 22, wherein
said atmosphere has a hydrogen pressure within a range of from 0.01 Mpa to 10 Mpa.

27. The method according to claim 22, wherein
said atmosphere has a temperature within a range of from room temperature to 150° C.

28. The method according to claim 15, wherein
said hydrogen storage metal material is capable of being in a state in which no hydrogen is stored by said hydrogen storage metal material.

29. The method according to claim 28, wherein
increasing a volume of said particulate hydrogen storage metal material results in said connecting material being weakened in the vicinity of said particulate hydrogen storage metal material.

30. The method according to claim 29, further comprising:
applying an external force to the weakened connecting material.

31. The method according to claim 28, wherein
said certain object comprises an electronic component, and
said another object comprises a circuit board.

32. The method according to claim 28, wherein
said atmosphere has a hydrogen pressure within a range of from 0.01 Mpa to 10 Mpa.

33. The method according to claim 28, wherein
said atmosphere has a temperature within a range of from room temperature to 150° C.

34. The method according to claim 15, wherein
said solder material comprises a cream solder, and
said particulate hydrogen storage metal material is dispersed throughout said cream solder.

35. The method according to claim 34, wherein
increasing a volume of said particulate hydrogen storage metal material results in said connecting material being weakened in the vicinity of said particulate hydrogen storage metal material.

36. The method according to claim 35, further comprising:
applying an external force to the weakened connecting material.

37. The method according to claim 34, wherein
said certain object comprises an electronic component, and
said another object comprises a circuit board.

38. The method according to claim 34, wherein
said atmosphere has a hydrogen pressure within a range of from 0.01 Mpa to 10 Mpa.

39. The method according to claim 34, wherein
said atmosphere has a temperature within a range of from room temperature to 150° C.

40. The method according to claim 15, wherein
increasing a volume of said particulate hydrogen storage metal material results in said connecting material being weakened in the vicinity of said particulate hydrogen storage metal material.

41. The method according to claim 40, further comprising:
applying an external force to the weakened connecting material.

42. The method according to claim 15, wherein
said certain object comprises an electronic component, and
said another object comprises a circuit board.

43. The method according to claim 15, wherein said atmosphere has a hydrogen pressure within a range of from 0.01 Mpa to 10 Mpa.

44. The method according to claim 15, wherein said atmosphere has a temperature within a range of from room temperature to 150° C.

45. A method of detaching two objects from another object, comprising:
subjecting to a first atmosphere having a first hydrogen occlusion condition,
 (i) a first connecting material interconnecting a first object and another object, with said first connecting material including
  (a) solder material, and
  (b) dispersed particulate first hydrogen storage metal material able to occlude hydrogen when subjected to said first atmosphere,
 such that said particulate first hydrogen storage metal material occludes hydrogen, thereby increasing a volume of said particulate first hydrogen storage metal material, and
 (ii) a second connecting material interconnecting a second object and said another object, with said second connecting material including
  (a) solder material, and
  (b) dispersed particulate second hydrogen storage metal material, said second hydrogen storage metal material being different than said first hydrogen storage metal material such that said second hydrogen storage metal material is not able to substantially occlude hydrogen when subjected to said first atmosphere and is able to occlude hydrogen when subjected to a second atmosphere having a different second hydrogen occlusion condition,
 such that said particulate second hydrogen storage metal material does not substantially occlude hydrogen, thereby not substantially increasing a volume of said particulate second hydrogen storage metal material; and
subjecting said second connecting material to said second atmosphere such that said particulate second hydrogen storage metal material occludes hydrogen, thereby increasing a volume of said particulate second hydrogen storage metal material.

46. The method according to claim 45, wherein said first hydrogen occlusion condition comprises a temperature and/or a hydrogen pressure of said first atmosphere, and
said different second hydrogen occlusion condition comprises a temperature and/or a hydrogen pressure of said second atmosphere.

47. The method according to claim 45, wherein each of said first and second hydrogen storage metal material is selected from the group consisting of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$, Pd, V, Ti and Zr.

48. The method according to claim 45, wherein each of said first and second hydrogen storage metal material is capable of being in a state in which no hydrogen is stored by a respective said each of said first and second hydrogen storage metal material.

49. The method according to claim 45, wherein said solder material comprises a cream solder,
said first connecting material comprises said particulate first hydrogen storage metal material dispersed throughout said cream solder, and
said second connecting material comprises said particulate second hydrogen storage metal material dispersed throughout said cream solder.

50. A method of detaching a certain object from another object, comprising:
weakening a connecting material interconnecting a certain object and another object, with said connecting material including solder material and dispersed particulate hydrogen storage metal material able to occlude hydrogen, by
 (i) subjecting said connecting material to a first atmosphere having a hydrogen occlusion condition such that said particulate hydrogen storage metal material occludes hydrogen, thereby increasing a volume of said particulate hydrogen storage metal material, and then
 (ii) subjecting said connecting material to a second atmosphere having a hydrogen release condition such that said particulate hydrogen storage metal material releases hydrogen, thereby decreasing a volume of said particulate hydrogen storage metal material.

51. The method according to claim 50, wherein said hydrogen occlusion condition comprises a temperature and/or a hydrogen pressure of said first atmosphere.

52. The method according to claim 51, further comprising:
repeatedly subjecting said connecting material to said first atmosphere having said hydrogen occlusion condition and then to said second atmosphere having said hydrogen release condition until said connecting portion is sufficiently weakened.

53. The method according to claim 51, further comprising:
applying an external force to the weakened connecting material.

54. The method according to claim 50, wherein said hydrogen storage metal material is selected from the group consisting of $LaNi_5$, $LaNi_{4.5}Al_{0.5}$, $Ti_{0.88}Zr_{0.12}Mn_{1.0}V_{0.4}Ni_{0.6}$, $LaNi_{4.5}Mn_{0.5}$, $Mg_2Ni$, Pd, V, Ti and Zr.

55. The method according to claim 54, further comprising:
repeatedly subjecting said connecting material to said first atmosphere having said hydrogen occlusion condition and then to said second atmosphere having said hydrogen release condition until said connecting portion is sufficiently weakened.

56. The method according to claim 54, further comprising:
applying an external force to the weakened connecting material.

57. The method according to claim 50, wherein said hydrogen storage metal material is capable of being in a state in which no hydrogen is stored by said hydrogen storage metal material.

58. The method according to claim 57, further comprising:
repeatedly subjecting said connecting material to said first atmosphere having said hydrogen occlusion condition and then to said second atmosphere having said hydrogen release condition until said connecting portion is sufficiently weakened.

59. The method according to claim 57, further comprising:
applying an external force to the weakened connecting material.

60. The method according to claim 50, wherein
said solder material comprises a cream solder, and
said particulate hydrogen storage metal material is dispersed throughout said cream solder.

61. The method according to claim 60, further comprising:
repeatedly subjecting said connecting material to said first atmosphere having said hydrogen occlusion condition and then to said second atmosphere having said hydrogen release condition until said connecting portion is sufficiently weakened.

62. The method according to claim 60, further comprising:
applying an external force to the weakened connecting material.

63. The method according to claim 50, further comprising:
repeatedly subjecting said connecting material to said first atmosphere having said hydrogen occlusion condition and then to said second atmosphere having said hydrogen release condition until said connecting portion is sufficiently weakened.

64. The method according to claim 50, further comprising:
applying an external force to the weakened connecting material.

* * * * *